United States Patent [19]

Miller

[11] 4,098,920
[45] Jul. 4, 1978

[54] METHOD OF CONTINUOUS PRODUCTION OF SUPER CONDUCTING WIRE

[75] Inventor: Gordon H. Miller, Littleton, Colo.

[73] Assignee: Texaco Inc., New York, N.Y.

[21] Appl. No.: 754,702

[22] Filed: Dec. 27, 1976

[51] Int. Cl.² ............................................. B05D 3/06
[52] U.S. Cl. ...................................... 427/46; 427/52; 427/62; 427/251; 427/253
[58] Field of Search ..................... 427/62, 253, 52, 46, 427/251

[56] References Cited

U.S. PATENT DOCUMENTS

| 3,268,362 | 8/1966 | Hanak et al. | 427/62 |
| 3,525,637 | 8/1970 | Kim | 427/253 |
| 3,595,693 | 7/1971 | Cecil et al. | 427/62 |
| 3,754,112 | 8/1973 | DeBolt | 427/46 |
| 4,005,990 | 2/1977 | Newkirk et al. | 427/62 |

Primary Examiner—John H. Newsome
Attorney, Agent, or Firm—Thomas H. Whaley; Carl G. Ries; Henry C. Dearborn

[57] ABSTRACT

A method of continuously producing a super conductive intermetallic compound. It includes passing a filament of a metallic substrate through a high temperature plating chamber. The filament is heated electrically to a higher temperature while plating gases of the metals which make up the intermetallic compound are introduced in the form of halides of such metals along with sufficient hydrogen to complete a chemical change which plates the superconductor on the filament.

1 Claim, 3 Drawing Figures

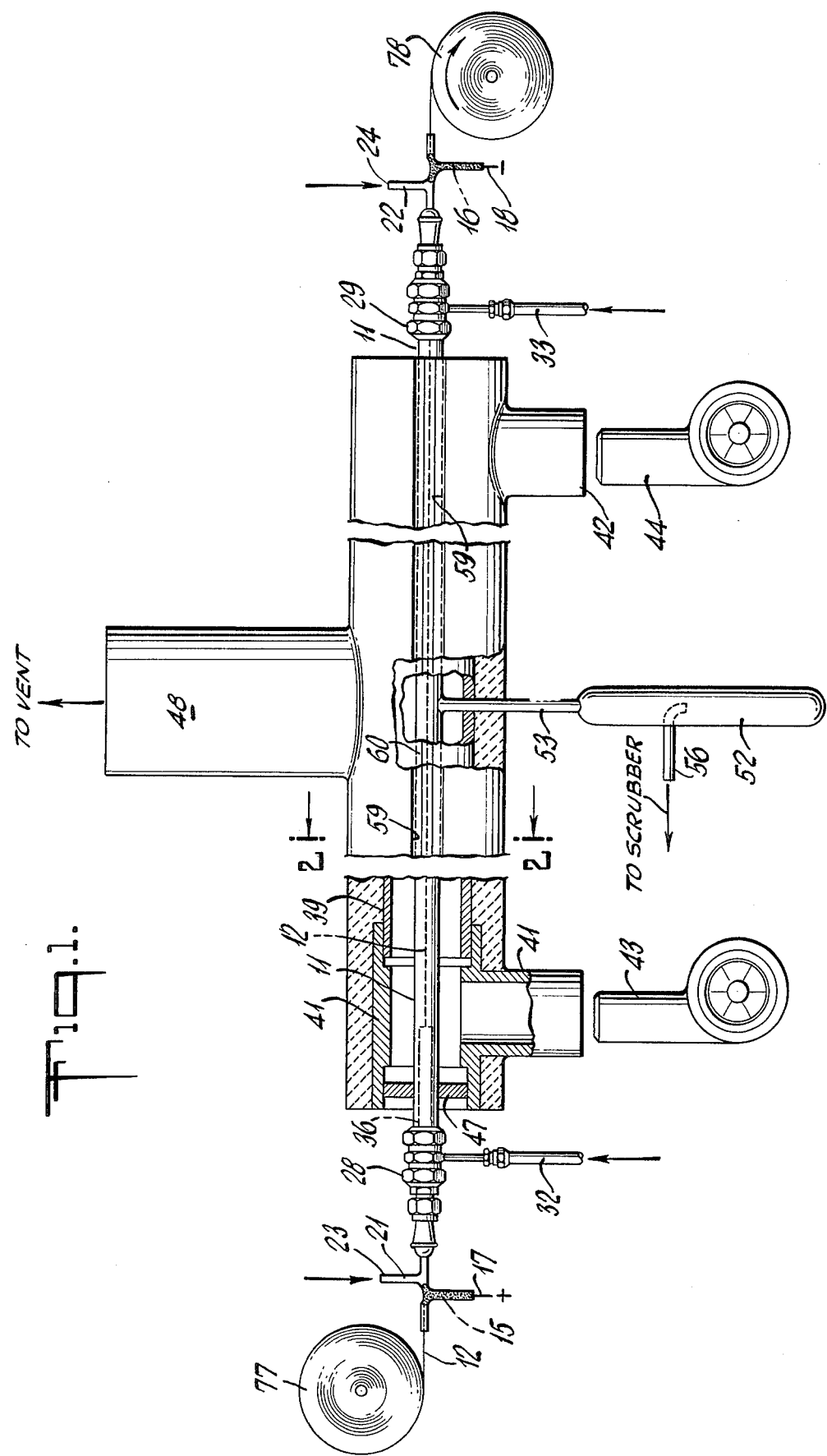

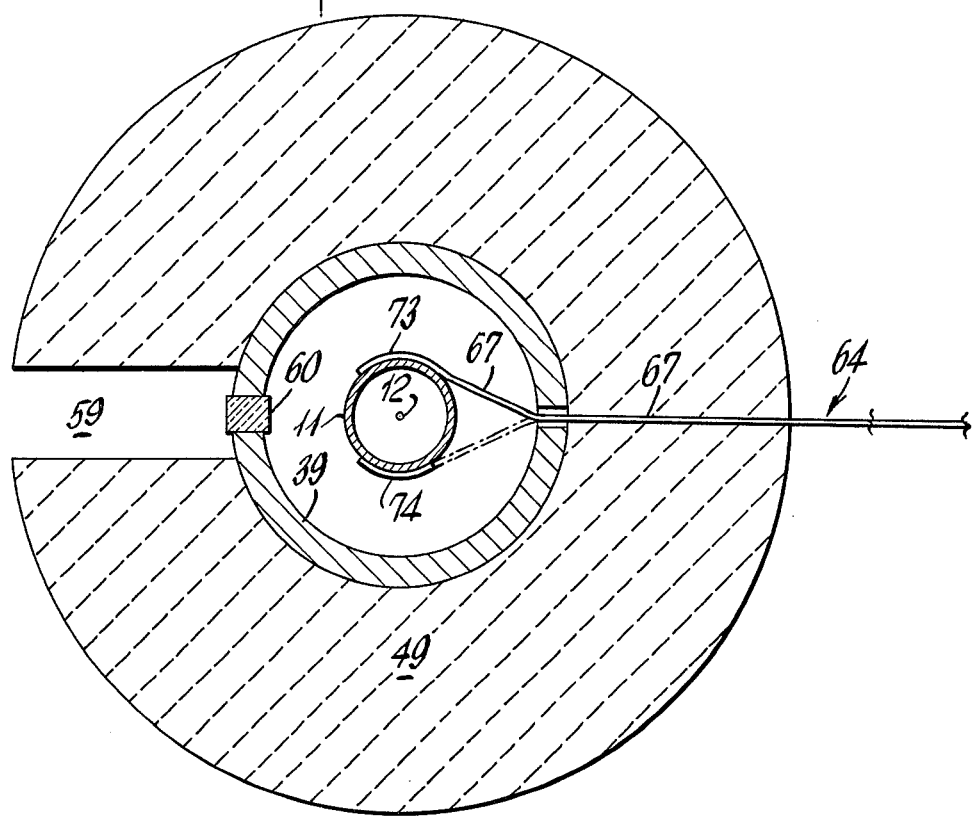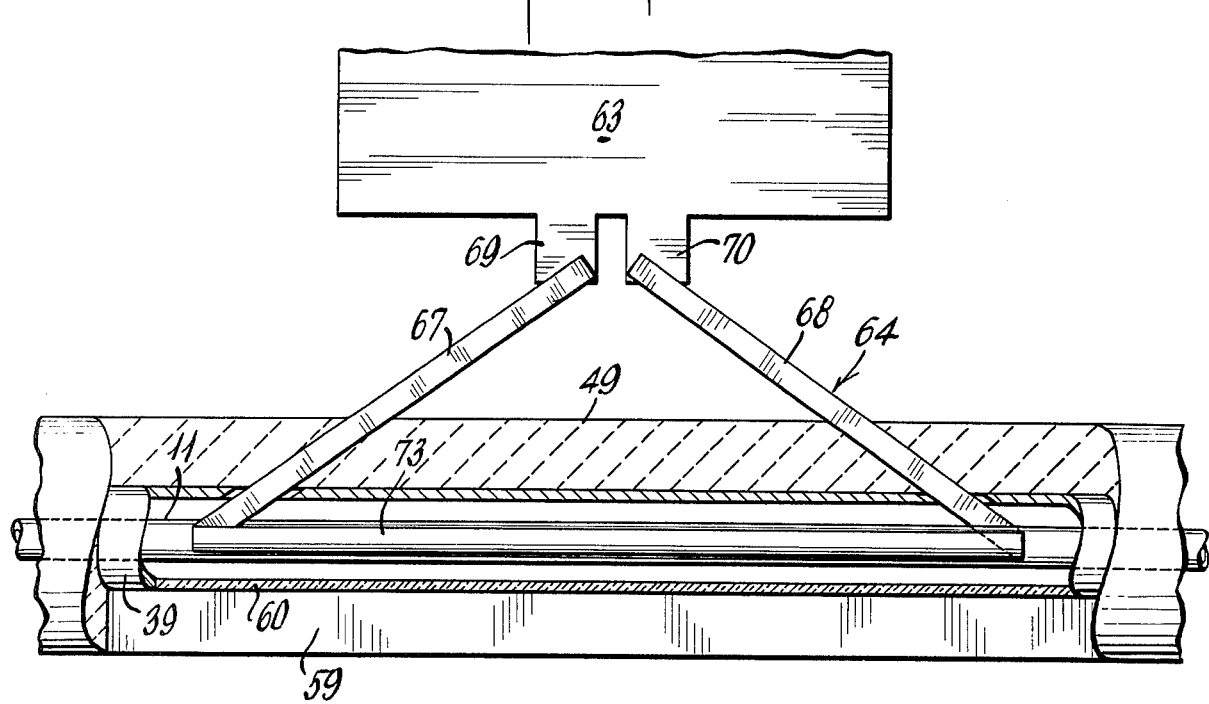

METHOD OF CONTINUOUS PRODUCTION OF SUPER CONDUCTING WIRE

BACKGROUND OF THE INVENTION

1. Field of the Invention

This invention concerns superconducting materials, in general. More specifically, it relates to a method for producing superconducting materials in a continuous manner on a filament substrate. Still more specifically, it concerns a method of continuous production of superconducting wire which includes niobium-germanium produced on the surface thereof by a chemical vapor plating procedure.

2. Description of the Prior Art

In the field of superconducting materials, there is a continuous effect to discover new materials which have superconductivity and that retain such property at higher temperatures than did the earliest known such materials. Most of the materials that have been known heretofore have critical temperature characteristics that are quite restricting in that they lose the superconductivity at temperatures which are not much above the boiling point of liquid helium. Such temperatures are quite considerably below the boiling point of hydrogen which is 20.4° K.

In the course of developing superconducting materials having higher transistion temperatures, there has been an intermetallic compound produced by one John R. Gavaler. It is the intermetallic compound niobium-germanium. This was found to have a superconducting transition temperature of 22.3° K. However, even though this high transition temperature is very significant because of the fact that it would make feasible the use of liquid hydrogen rather than the more expensive and less abundant liquid helium, the Gavaler discovery employed a sputtering process for producing the intermetallic compound and therefore it was only applicable to a batch-type method. Consequently, it has not been found attractive for practical use, as yet.

Other know procedures for making superconducting wire have had substantial drawbacks because of the characteristics of the superconducting compounds, particularly in regard to the lack of ductility. Consequently, a majority of present superconducting devices employ superconducting wires made as composites of niobium-titanium and copper. Such composites are made by inserting small rods of niobium-titanium into copper tubes and stacking such tubes into a billet. The billet is then extruded into a rod with small diameter and then drawn into wires of appropriate size. Despite this technique being the most wide spread, such a wire is limited for some applications by its superconducting properties because the transition temperature of niobium-titanium is about 9° K. which is quite close to the temperature of liquid helium as a refrigerant. Also, this compound has its superconducting properties destroyed by magnetic fields above about 10 teslas, so that it is not useful for high field magnets.

Another superconducting material is niobium-tin which has a transition temperature of about 18° K. and a critical field of 21 teslas. But, this material is quite brittle, breaks easily and is difficult to handle. Furthermore, it has poor thermal conductivity which creates problems in maintaining a superconducting state. Heretofore, the best approach for employing niobium-tin superconductors has been to manufacture them in the form of a tape or ribbon composed of several layers of different materials. This requires rather complicated mechanical procedures for the manufacture, and consequently involves substantial drawnbacks.

Consequently, it is an object of this invention to teach a method for continuously producing various superconducting wires.

Another object of the invention is to teach a method for producing a superior superconducting intermetallic compound, plated onto the surface of a filament of a niobium wire substrate.

SUMMARY OF THE INVENTION

Briefly, the invention concerns a method of continuous production of superconducting wire, which method comprises the steps of passing a filament of metallic substrate through a plating chamber. It also comprises the steps of heating said wire filament in said plating chamber to a high temperature sufficient to cause plating thereon, and introducing plating gas compounds of each of the elements of a superconductor compound and sufficient hydrogen to carry out a chemical reaction with said compound plating out on said wire substrate. It also comprises the step of passing said plated filament out of said chamber for rapid cooling and for collection thereof.

Again briefly, the invention concerns a method of continuous production of a superior superconducting compound in wire form. It comprises the steps of passing a filament of niobium wire substrate through a plating chamber, and heating said wire filament in said plating chamber to a temperature of about 1200° C. by generating a standing half wave of radio frequency current in a predetermined length of said wire and by simultaneously passing a DC electric current through said wire in said chamber. It also comprises introducing gaseous germanium-chloride and niobium-chloride and hydrogen in relative amounts to produce optimum rate of plating of the superconductor compound niobium-germanium on said niobium substrate and introducing an inert gas to assist in temperature control, and passing said plated filament out of said chamber for freezing said compound in place on said filament.

BRIEF DESCRIPTION OF THE DRAWINGS

The foregoing and other objects and benefits of the invention will be more fully set forth below in connection with the best mode contemplated by the inventor of carrying out the invention, and in connection with which there are illustrations provided in the drawings wherein:

FIG. 1 is a schematic side elevation, partly broken away in cross-section, illustrating a typical plating chamber with related elements for carrying out a preferred method according to the invention;

FIG. 2 is an enlarged view taken along the lines 2—2 of FIG. 1 and looking in the direction of the arrows; and FIG. 3 is an enlarged schematic partial plan view, illustrating the antenna structure for a radio-frequency generator that is employed in connection with the plating chamber equipment shown in FIG. 1.

DESCRIPTION OF THE PREFERRED EMBODIMENT

There is a large portential for industrial uses of superconductivity in such areas as electrical transmission, electric motors, high field strength magnetic devices, and many other similar applications. However, there is no known method of commercially producing one of the more promising superconductors that has recently been discovered. It is the intermetallic compound niobium-germanium which was produced by a sputtering process. The process was, however, one that clearly did not produce this superconductor in commercially usable form.

Furthermore, while other known superconducting materials have been manufactured in accordance with various teachings, they all have involved difficulties in fabricating superconducting wire. Consequently, this invention is applicable to producing a wire plated with all the various combinations of niobium, vanadium, titanium, tin, gallium, and germanium as well as many others, in a very beneficial manner. And, the above mentioned new intermetallic compound niobium-germanium which has been found to have a superior superconducting transition temperature is an especially attractive superconducting material to fabricate in wire form, in accordance with this invention.

This invention teaches a method that will make the production of superconducting wires a relatively simple continuous process, so that the practical uses should become quite available. Furthermore, the use of this invention is particularly attractive in the ability to teach a method of producing the intermetallic compound niobium-germanium which has been found to have the superior superconducting transition temperature which is several degrees above the boiling point of hydrogen. The potential of this aspect is great since it should make feasible the industrial use of this superconducting material with liquid hydrogen, rather than the more expensive and less abundant liquid helium.

The method will be described in connection with apparatus that is illustrated in the drawings and that had been developed heretofore in connection with a chemical vapor plating process that was described in connection with a report made for the National Aeronautics and Space Administration under a contract NAS3-7948, which report was entitled "IMPROVED ABLATIVE MATERIALS" by Gordon H. Miller and Joseph A. Haefling, and dated Dec. 1, 1967.

It will be understood that the temperature references made in this application which use the designation K, are using the absolute scale that is well known as Kelvin. Similarly, the designation C, as used with temperatures stands for the centigrade or Celsius scale.

A preferred form of apparatus for carrying out the invention is illustrated in the drawings. There is an elongated plating chamber 11, which is preferably constructed of a special glass. However, it will be appreciated that it could be made of quartz if desired. The special glass that may be employed is one that is commercially available. It is extensively leached until it is nearly all silicon dioxide, and then it is refused to make glass-like tubing or other shapes which have the essential qualities of fused quartz.

This plating chamber 11 takes the form of an elongated tube, and there is a filament 12 which is made up of a substrate material that will be described with more particularity below. The filament 12 extends along the axis of the plating chamber 11. The basic substrate material of the filament 12 is preferrably niobium. However, it will be appreciated by one skilled in the art that it might be made of tungsten or other substrate materials such as zirconium, tantalum, titanium, or other metallic wires.

The substrate filament, or wire 12 extends through a pair of mercury seals 15 and 16. These have electrodes 17 and 18, respectively mounted in the seals so as to make electrical contact with the mercury therein. These electrodes 17 and 18 are employed in order to apply a DC current through the substrate wire 12 between the electrodes, in a manner and for a purpose to be described more fully below.

It will be appreciated that the mercury seals 15 and 16 are constructed of appropriately shaped tubings 21 and 22. They are shaped as indicated in the drawing so that the mercury 15 and 16 (which creates the seals) fills the horizontally situated passages through the tubings 21 and 22. This creates the desired vapor seals but allows the substrate wire 12 to pass through the mercury in each case. These tubing elements 21 and 22 have inlet extensions 23 and 24, respectively, which are provided for introducing hydrogen gas and/or inert gas such as argon which are introduced into the plating chamber 11 in accordance with the method.

The tubing elements 21 and 22 are connected onto the respective ends of the plating chamber 11 by means of couplings 28 and 29. These are conventional units for mechanically making vapor tight seals around the outside of the horizontal ends of the tubing elements 21 and 22. In addition, these couplings 28 and 29 have internal structure (not shown) for permitting introduction of plating gases through a pair of transversely extending inlet pipes 32 and 33 respectively.

There is an interior tube 36 (only one shown) at each end of the plating chamber 11. These are associated with the couplings 28 and 29. They form an annular passage inside of the plating chamber 11 at each end but outside of the filament or wire 12. These annular passage ways carry the plating gases from the inlet pipes 32 and 33 to the inside of the plating chamber 11 while maintaining a separation from the hydrogen or argon that is flowing in through the extensions 23 and 24.

The walls of the plating chamber 11 are preheated and maintained at a sufficient temperature by means of enclosing most of the length of the chamber tube 11 inside of a cylindrical enclosure 39 that has its ends coupled with a pair of Tees 41 and 42. The Tees have open ends extending vertically downward to accommodate the input of hot air from a pair of heat guns 43 and 44 respectively. Also there are, of course, heat seals 47 (only one shown) at the outside ends of the Tees 41 and 42 to keep the hot air in around the plating chamber 11. Such hot air exits from the top of the enclosure 39 through a centrally located vent pipe (not visible) that is enclosed by a vertical extension 48 which is part of a relatively thick cylindrical thermal insulation layer 49. This insulation layer 49 surrounds and encloses the cylindrical enclosure 39 and the Tees 41 and 42 at the ends thereof. Also, the insulation surrounds the vent pipe inside of extension 48.

It will be appreciated that the enclosure 39 and the Tees 41 and 42, as well as the vent pipe (inside extension 48 not visible) that connects with the enclosure 39, may be made of any feasible heat resistant material. For example, there is an asbestos-cement that is known by the commercial tradename Transite.

There is a condenser tube or chamber 52 that connects with the plating chamber 11 via a tube 53, located at the bottom near the center of the chamber 11. This tube 53 carries the spent plating gas out from the plating chamber 11 to the condenser 52. About half way up the length of the condenser chamber 52, there is an exit tube 56 through which the gases are carried to a scrubber (not shown) as indicated by the caption.

In order to be able to observe the plating action during the procedure, there is longitudinal opening 59 in the insulation 49. Also, in line with the opening 59 there is an elongated window 60 in the enclosure 39. Both the opening 59 and the window 60 extend along parallel with the axis of the plating chamber 11.

In order to carry out radio frequency heating of the wire 12, there is radio frequency generator 63 that is schematically indicated in the FIG. 3 showing. The generator has an antenna structure 64 including a pair of leads 67 and 68 that connect to terminals 69 and 70 respectively, of the generator 63. It will be observed that these leads 67 and 68 make electrical connection with upper and lower antenna elements 73 and 74 respectively. These elements may take the form of metallic foil. They lie along the outside of the plating chamber tube 11 for a substantial portion of the length thereof.

The radio frequency antenna structure and arrangement which is for providing radio frequency heating of the substrate wire (and its plating surface) will preferably take a form like appropriate ones of the antenna elements described in a patent to H. B. Forney U.S. Pat. No. 3,572,286 issued March 23, 1971 and assigned to the same assignee as this invention. It will be understood that while that patent described various alternative structures for providing the desired radio frequency heating of a filament, the type structure that is employed here is substantially like that illustrated and described in the Forney Patent in connection with FIG. 3b thereof. Furthermore, the use of the necessary couplers (not shown) and tuning stubs (not shown) will be such as to create a designed single loop standing wave current in the filament 12. And, a preferable distribution of the power is in accordance with that illustrated in FIG. 6b of the Forney patent. It may be noted that the location of the radio frequency generator 63 and antenna leads 67, 68 are behind the equipment as viewed in FIG. 1. Consequently, the leads extend horizontally through the insulation 49 and the enclosure 39.

It will be understood, of course, that the filament wire 12 which extends along the axis of the plating chamber 11 will be moved longitudinally by being released from a reel 77 and wound onto to another reel 78 at the other end.

METHOD

A preferred method according to this invention will be described as follows, in relation to the apparatus illustrated and described above. It will be appreciated, however, that various other and different forms of apparatus might be employed in connection with carrying out the method. Broadly, the method is one which provides for continuous production of superconducting compounds in wire form.

The method which is applicable to continuous production of superconducting wire comprises at least the following steps. However, they are not necessarily carried out in the order recited.

A filament of a metallic wire substrate is passed through a plating chamber. In the apparatus illustrated this is the filament 12 which is wound onto the reel 78 while unreeling from the other reel 77. As indicated above, the material of this substrate might be tungsten or other substrate material including niobium, zirconium, tantalum, titanium or other metals.

The wire is heated in the plating chamber 11 to a high enough temperature to cause plating on the surface thereof. The particular temperature may vary depending upon the substrate and the superconductor compound being plated.

Plating gas compounds are introduced into the chamber 11 along with sufficient hydrogen to promote a chemical reaction which forms an intermetallic superconducting compound plated onto the heated substrate wire.

And, the plate wire is passed out of the plating chamber where it rapidly cools as it is collected onto the winding reel 78.

In a more specific application of the method, it provides for continuous production of a superior superconducting compound in wire form. It comprises the following steps.

A filament of niobium wire substrate is passed through the plating chamber 11 by reeling and unreeling along the axis of the chamber. This step of passing a filament of niobium wire substrate through a plating chamber is illustrated by the reeling of the niobium wire 12 through the mercury seals 15 and 16 along the axis of the plating chamber 11 and onto the take-up reel 78.

Another step is that of heating the wire filament 12 to a temperature of about 1200° C. This is accomplished by generating a standing half wave of radio frequency current in a length of the wire 12 that is determined by the configuration of antenna elements 73 and 74 plus the couplers (not shown) of the radio frequency generator 63 arrangement which was described above. In addition, in order to save power it has been found that some of the heating of the wire 12 may be accomplished by simulteously applying a DC electric current through the wire 12. This is accomplished by introducing such DC current at the terminals 17 and 18 which are connected to the mercury seals 15 and 16 and consequently make good electrical connection to the wire 12 at these seals. It will be appreciated that the necessary heating is not feasible using only a DC current because the resistance of the heated wire becomes very low and if the power required is all supplied that way the incoming substrate wire would be overheated. However, the use of DC current will produce an extended plating zone beyond the ends of the length of wire that is heated by the radio frequency current.

Another step of the method involves introducing germanium-chloride and niobium-chloride as well as hydrogen, in relative amounts to produce optimum rate of plating of the super conductor compound niobium-germanium on said niobium substrate. This step includes the introduction of an inert gas to assist in the temperature control during the procedure. It will be noted that the gaseous germanium-chloride and niobium-chloride will be introduced through the plating gas inlet pipes 32 and 33. They will flow into the interior of the plating chamber tube 11 through the annular space around the interior tubes 36 that are at the ends of the plating chamber. At the same time the hydrogen which is required, along with the inert gas (such as argon) will be introduced through the extensions 23 and 24 of the tubing elements 21 and 22. Also, it will be observed that these two gases are continuously introduced to flow in around the wire 12 on the inside of the tubes 36 so that they reach the interior of the plating chamber a short distance from the ends thereof.

It will be understood that in the plating chamber 11, along the length of the wire 12 that is maintained at the high temperature of 1200° C., the plating action will take place to form the intermetallic compound niobium-germanium on the surface of the niobium wire substrate. Then the plated wire is passed out of the plating chamber 11, as it is reeled onto the reel 78. This subjects the wire to relatively low temperature, e.g., room temperature conditions which freezes the super conducting compound in place on the substrate filament.

It will be appreciated by one skilled in the art that various other combinations of niobium, vanadium, titanium, gallium, tin, germanium and many others could be combined by chemical vapor plating in accordance with the method indicated by this invention. However, it is particularly to be noted that this method makes practical the production of the superconducting material niobium-germanium which has the extremely beneficial qualities of a transition temperature that is higher than the boiling point of hydrogen.

Also, it will be understood that care will be required to keep the plating materials free of moisture since the halides react readily with water to form oxychlorides.

While particular embodiments of the invention have been described above in considerable detail in accordance with the applicable statutes, this is not to be taken as in any way limiting the invention but merely as being descriptive thereof.

I claim:
1. Method of continuous production of a superior superconducting compound in wire form, comprising the steps of
   passing a filament of niobium wire substrate through a plating chamber,
   heating said wire filament in said plating chamber to a temperature of about 1,200° C. by generating a standing half wave of radio frequency current in a predetermined length of said wire and by simultaneously passing a DC electric current through said wire in said chamber,
   introducing gaseous germanium chloride and niobium chloride and hydrogen in relative amounts to produce optimum rate of plating of the super conductor compound niobium-germanium on said niobium substrate and introducing an inert gas to assist in temperature control, and
   passing said plated filament out of said chamber for freezing said compound in place on said filament.

* * * * *